US012481217B1

(12) United States Patent
De Caria

(10) Patent No.: US 12,481,217 B1
(45) Date of Patent: Nov. 25, 2025

(54) THERMAL DEVELOPMENT APPARATUS OF FLEXOGRAPHIC PLATES

(71) Applicant: Vianord Engineering Sasu, Carros (FR)

(72) Inventor: Riccardo De Caria, Carros (FR)

(73) Assignee: Vianord Engineering Sasu, Carros (FR)

( * ) Notice: Subject to any disclaimer, the term of this patent is extended or adjusted under 35 U.S.C. 154(b) by 0 days.

(21) Appl. No.: 18/795,253

(22) Filed: Aug. 6, 2024

(51) Int. Cl.
*G03F 7/34* (2006.01)
*B41M 1/04* (2006.01)

(52) U.S. Cl.
CPC ..................................... *G03F 7/34* (2013.01); *B41M 1/04* (2013.01)

(58) Field of Classification Search
None
See application file for complete search history.

(56) References Cited

U.S. PATENT DOCUMENTS 5,575,211 A * 11/1996 Harrison ................. B41F 35/02 101/423
6,797,454 B1 9/2004 Johnson et al.
2005/0142494 A1 6/2005 Hackler et al.
2007/0051262 A1* 3/2007 Gotsick ................... B41C 1/055 101/401.1
2009/0199733 A1 8/2009 Dudek et al.
2010/0242761 A1 9/2010 Hackler et al.
2012/0067235 A1 3/2012 Odle et al.
2013/0108966 A1 5/2013 Arnold et al.
2015/0219995 A1 8/2015 Arnold
2017/0051262 A1 2/2017 Harris et al.
2017/0173937 A1 6/2017 Arnold et al.

FOREIGN PATENT DOCUMENTS

JP 2005292761 A 10/2005

OTHER PUBLICATIONS

Italian search report for corresponding application No. IT202300016869, Feb. 23, 2024, 9 pages.

* cited by examiner

*Primary Examiner* — Joshua D Zimmerman
(74) *Attorney, Agent, or Firm* — Patterson Intellectual Property Law, PC

(57) ABSTRACT

A thermal development apparatus for removing non-crosslinked polymer or monomer from a first surface of a flexographic plate comprises a moving assembly defining a support surface for a second surface of the plate and an operating assembly applying an absorbent material to the first surface during movement thereof. A heating cylinder heats the outer surface to a temperature sufficient to melt a portion of the non-crosslinked polymer/monomer. Pneumatic actuators operatively connected to the heating cylinder cause contact between the absorbent material and the plate. A pressure regulating device adjusts the air pressure in cylinders of the actuators, according to an initial or threshold value to push the heating cylinder from a non-operating position to an operating position on the plate, and further allowing variance in the initial pressure value and correspondingly the operating position, thus causing a variation in the pressure applied by the heating cylinder on the plate.

7 Claims, 7 Drawing Sheets

THERMAL DEVELOPMENT APPARATUS OF FLEXOGRAPHIC PLATES

CROSS-REFERENCES TO RELATED APPLICATIONS

This application claims right of priority to Italian Patent Application No. 102023000016869, filed on Aug. 7, 2023, and which is hereby incorporated by reference in its entirety.

FIELD OF THE INVENTION

The present invention falls within the field of the manufacture of systems for preparing digital flexographic printing plates. In particular, the present invention relates to a thermal development apparatus of a flexographic plate.

BACKGROUND

Flexography is a direct rotary printing method that uses relief plates made of photopolymer materials. The plates are flexible and soft, hence the name flexography. These plates are inked and the print is obtained by direct deposition of the ink on the medium to be printed due to a light pressure applied by a printing cylinder on which the plates are positioned.

Flexography is a high-speed printing process capable of printing on many types of absorbent and non-absorbent materials. Some typical applications of flexographic printing are the production of paper and plastic bags, milk cartons, disposable cups, and the like; however, thanks to current advances in print quality, flexographic printing is also used, for example, to print newspapers, envelopes, labels, and to print on plastic, acetate films and sheets, wrapping paper and various materials used for product packaging.

A particular flexographic printing process is "digital flexography", in which digital plates (or "flexographic plates") are used. In these plates, the photopolymer is originally covered with a surface layer of a material that prevents photo-exposure, such as, for example, a layer of carbon or graphite. This layer of material is etched to create the negative image of the print subject. This etching step is typically carried out using a digital laser controlled by a computer (hence the acronym CTP "computer to plate" used in the field to indicate this step of the pre-printing process). The plate is then photo-exposed and the material not exposed to light is eliminated during an operation known as "development of the flexographic plate".

According to a first known method, the development of a digital plate takes place through a washing operation which involves the use of a liquid (water- or solvent-based) intended to dissolve and/or soften the polymer or monomer previously not exposed to light. In presence of this liquid, the plate is subjected to the mechanical action of brushes that act on the surface of the plate to facilitate detachment of the monomer or polymer not exposed to light.

According to a second known method, alternative to washing, flexographic plates are thermally developed through a process that removes the polymer or monomer not exposed to light through contact with absorbent material, wherein this contact takes place when the unexposed polymer or monomer is brought to a temperature that melts it so that it flows into the absorbent material and hence so that it can be removed in contact with this material. Compared to the washing method, thermal development of the plates is a substantially "dry" method and hence does not require a drying time downstream of the development operation, the time being instead required by the development process involving washing with a liquid.

In recent years, different apparatus for the thermal development of flexographic plates have been proposed. Examples of these apparatus are disclosed, for example, in EP1526410, EP2774003, EP1850183, and EP1553456.

In general, a thermal development apparatus of a flexographic plate comprises a moving assembly that supports the flexographic plate and moves the same along a predetermined trajectory. In a first known embodiment, for example shown in WO2022026980, EP2501550, or EP3033236, the moving assembly has a conveyor configuration comprising two rollers (at least one of which is motorized) and a belt wound around the two rollers and moved thereby. The flexographic plate is positioned on this belt. Rotation of the two rollers causes movement of the belt, and hence of the flexographic plate integral therewith.

In an alternative embodiment, shown for example in EP1624343 or EP1899766, the moving assembly is provided with a single motorized cylinder on the surface of which the plate is positioned. In use, the cylinder is rotated about its longitudinal axis and the plate carries out corresponding rotations about the axis of the cylinder.

In any case, the moving assembly defines a moving support surface on which the flexographic plate is positioned. More precisely, the plate rests on this moving surface with a base surface (or inner surface) thereof opposite the outer surface previously exposed to light and hence requiring thermal development.

To allow positioning of the plate on the moving assembly, a series of holes is first made in the plate, close to an edge thereof, wherein these holes allow a plate to be connected to a pin bar (i.e., a bar provided with a row of projecting pins). This pin bar is fixed to the surface of the belt or to the motorized cylinder, depending on the configuration of the moving assembly.

In addition to a moving assembly, a thermal development apparatus comprises a development operating assembly to apply, during movement of the plate, the absorbent material to the outer surface of the plate, i.e., to develop the plate. Typically, a development operating assembly comprises heating means to bring the outer surface of the plate to a temperature sufficient to melt/liquefy the polymer and hence to allow its removal through contact with the absorbent material. For this purpose, the development operating assembly comprises feeding means of the absorbent material and contact means acting on the absorbent material to make it adhere to the outer surface of the plate so as to absorb, and hence remove, the non-crosslinked polymer/monomer.

Typically, the feeding means comprise a plurality of rollers/cylinders that configure a path for the absorbent material between a first roller, from which the absorbent material is unwound, and a last roller on which the material is rewound after contacting the outer surface of the plate. Usually, tensioning rollers/cylinders are provided to maintain the correct feed tension of the absorbent material. The contact means act on the absorbent material at a predetermined point of its path causing it to adhere to the outer surface of the plate.

A known embodiment, schematically shown for example in EP1740392, provides for the use of a heating cylinder on a portion of which the absorbent material is conveyed. The heating cylinder is typically defined by a cylindrical body made of metal material and its outer surface, on which the absorbent material moves, is brought to a predetermined temperature by at least one electrical resistor. In this embodiment, the contact means comprise a pushing unit acting on the heating cylinder to bring the absorbent material, conveyed around the heating cylinder, in contact with the outer surface of the plate.

From an operational viewpoint, during the development process the plate is moved several times along the path/trajectory defined by the moving assembly and thus comes into contact several times with fresh absorbent material supplied by the feeding means. In the case in which movement of the plate is implemented by means of a motorized cylinder and in which a heating cylinder is used (according to the solution described above), during the process the plate is subjected to subsequent rotations, thus coming into contact, at each rotation, with the heating roller until complete removal of the non-crosslinked polymer/monomer, i.e., until complete development of the plate.

As compared to other known solutions, the use of a heating cylinder is particularly advantageous since heating of the plate takes place simultaneously to removal of the non-crosslinked polymer/monomer obtained by means of the absorbent material. For this reason, in recent years this solution has been more preferred than other known solutions in which heating of the plate takes place at a different point with respect to the point where the material is applied, more precisely at a point farther upstream with respect to the trajectory along which the plate is moved.

With reference to the diagram in FIG. 1, known apparatus provided with a heating cylinder (220) usually have a pushing unit (250) comprising a pair of actuators (250A) that push, with a constant force, the heating cylinder (220) toward the plate (500) during its movement on the support cylinder (110). Mechanical means (600) are also provided to adjust the distance between the heating roller (220) and the plate (500). As the distance decreases, the heating roller (220), and hence the absorbent material (B), adhere more closely to the plate (500), thus removing the non-crosslinked polymer or monomer more in depth. On the contrary, by increasing the distance, the action of the heating cylinder (200) and of the absorbent material (B) is less intense.

The hydraulic actuators (250) push the heating cylinder (220) at opposite ends thereof. The mechanical means (600) usually comprise a pair of regulating wedges (C), each installed on a support sidewall (F) of the apparatus 1. Each wedge (C) contacts through a first side (C1) a guide surface (SG) fixed to a corresponding sidewall (F) and through a second side (C2) an abutment surface (SR) integral with the rotation axis of the heating roller (220). For each wedge (C) a regulating actuator (TC) is provided, which moves the wedge (C) in vertical direction. The vertical movement of the wedge (C) results in a displacement of the heating roller (220) with respect to the plate (500). With reference to the diagram of FIG. 1, an upward displacement of the wedges (C) causes a corresponding movement of the heating roller (220) away from the surface of the plate (5); on the contrary, a lowering of the wedges (C) leads to a movement of the heating roller (220) toward the surface of the plate (500).

Therefore, from the above it can be seen that the operating condition of the heating cylinder (220) is determined by the combined action of the above-described pushing unit (250) and mechanical means (600). On the one hand, the pushing unit (250) constantly pushes, through its hydraulic actuators (250), the heating cylinder (220) toward the plate (500), whereas, on the other hand, the mechanical means (600) adjust the distance at which the heating roller (220) is positioned with respect to the plate (500) and hence the depth at which the absorbent material penetrates into the surface layer of the plate to develop it. Essentially, the force applied by the pushing unit (250) on the heating cylinder (220) is always constant, while its position with respect to the plate (and hence the penetration of the absorbent material into the plate) depends on the adjustment implemented with the mechanical means (600).

In view of the above, in the prior art solution described above (schematically shown in FIG. 1) the adjustment method of the operating condition of the heating cylinder is particularly complex and thus not advantageous in terms of both design and final production costs. Besides the pair of hydraulic actuators used to constantly push the heating cylinder toward the plate, a further pair of actuators (normally electrical) must be provided to adjust the position of the regulating wedges. This need makes the assembly of the machine, on the one hand, and, on the other hand, the subsequent control thereof more complex.

Another drawback of the prior art solution shown in FIG. 1 lies in that the distance of the heating cylinder (220) from the plate (500) cannot be changed during the development step, i.e., while the absorbent material (B) is fed. In other words, adjustment by the mechanical means (600) is carried out with the heating cylinder (220) stopped. Of course, this condition negatively affects the plate processing times.

Yet another limit lies in the difficulty of carrying out precise adjustment with the mechanical means (600) described above. In fact, the thickness of a flexographic plate is in the order of millimetres (for example five mm) and hence the distance of the heating roller (220) with respect to the plate (500) must be varied in a range in the order of tenths of millimetres. The Applicant has observed that through a wedge system (C) such as the one described it is very difficult to carry out precise adjustments within this range.

The Applicant has therefore observed that there is a need to provide a new technical solution that allows the configuration of the thermal development operating assembly to be improved, with particular reference to adjustment of the operating condition of the heating cylinder, i.e., regulation of the pressure with which it acts on the flexographic plate.

BRIEF SUMMARY

A thermal development apparatus of a flexographic plate is disclosed herein that allows the aforementioned problem to be solved or limited. Within this aim, an object may be to provide a thermal development apparatus that allows the operating condition of the heating cylinder to be adjusted more easily. Another object may be to provide a thermal development apparatus that avoids the use of mechanical means to adjust the distance between the heating cylinder and the plate. Yet another object may be to provide a thermal development apparatus in which the adjustment principle of the operating condition of the heating cylinder is less complex and more advantageous also in terms of costs. Yet another object may be to provide a thermal development apparatus that allows the processing times, i.e., the times required for thermal development of the plate, to be reduced. Yet another object of the present disclosure may be to provide a thermal development apparatus of a plate that is reliable and easy to produce at competitive costs.

The Applicant has observed that this aim and these objects can be achieved using a pushing unit for the heating cylinder which is provided with pneumatic actuators and with a pressure regulating device for adjusting the air pressure with which these actuators are operated. Through this regulating device the pressure with which the actuators act on the heating cylinder, and thus the relative position of the heating cylinder with respect to the plate, is adjusted. More precisely, a pressure increase in the cylinders of the pneumatic actuators causes an increase in the pressure with which the heating roller acts on the plate and hence in the penetration depth of the absorbent material penetrates into the plate to develop it. The contrary happens if the pressure in the cylinders decreases.

In particular, the aim and the objects indicated above may be achieved by an apparatus for removing non-crosslinked polymer or monomer from a first surface of a flexographic plate, wherein the apparatus comprises a moving assembly defining a support surface for a second surface of the plate opposite the first surface, wherein the moving assembly moves the plate along a predetermined trajectory. In an embodiment, the apparatus further comprises a developing operating assembly for applying an absorbent material to the first surface of the plate during the movement thereof, and the developing operating assembly comprises:

- feeding means of the absorbent material comprising at least one feeding cylinder and one collecting cylinder of the absorbent material;
- a heating cylinder for heating the first surface of the flexographic plate to a temperature sufficient to melt at least a portion of the non-crosslinked polymer/monomer, wherein the absorbent material is fed so as to partially envelop the heating cylinder;
- a pushing unit acting on the heating cylinder to cause a contact between the absorbent material and the first surface of the plate so that the melted polymer/monomer is removed by the absorbent material.

In an embodiment as disclosed herein, the pushing unit may comprise at least one pair of pneumatic actuators operatively connected, directly or indirectly, to the heating cylinder, wherein each of the actuators comprises a cylinder supplied with pressurized air and a rod movable with respect to the cylinder. In an embodiment, the pushing unit further comprises a pressure regulating device for adjusting the value of the air pressure in the cylinder of each actuator. Further to an initial pressure value the actuators push the heating cylinder from a non-operating position to an operating position on the flexographic plate, and wherein the regulating device allows the initial pressure value to be varied thus causing a consequent variation in the pressure applied by the heating cylinder on the flexographic plate.

Advantageously, the operating condition of the heating roller, i.e., the pressure with which it acts on the plate can be varied merely by adjusting the pressure applied in the cylinders of the actuators, without the need to provide mechanical regulation means such as those of the prior art and hence in a much simpler and less expensive way with respect to the solutions proposed to date by the prior art.

According to a possible embodiment, the apparatus comprises a control unit (ECU) that controls the regulating device so as to increase or decrease the air pressure in the cylinder of each actuator upon completion of a predetermined number of passages of the flexographic plate along the movement trajectory defined by the moving assembly.

According to a possible embodiment, the pushing unit comprises a connecting mechanism that operatively connects the actuators to the heating cylinder, wherein the connecting mechanism defines the predetermined trajectory along which the heating cylinder is moved.

Preferably, the apparatus comprises a support frame comprising a pair of opposing sidewalls and the crank mechanism comprises a pair of connecting levers hinged to the sidewalls so as to rotate, with respect to the sidewalls, about an axis parallel to the rotation axis of the heating cylinder, wherein each lever is operatively connected to a corresponding one of the pneumatic actuators and wherein the levers rotatably support the heating cylinder at opposite ends thereof.

Preferably, the levers are configured so as to define a movement trajectory of the heating cylinder that develops along an arc of a circle whose centre is coaxial to the rotation axis of the levers.

According to a possible embodiment thereof, each lever has a substantially L-shaped configuration, wherein a longer arm extends substantially between the rotation axis and a first end connected to an end of the rod of the corresponding actuator and wherein a shorter arm extends substantially between the rotation axis and a second end rotatably supporting a corresponding end of the heating cylinder.

According to a possible embodiment, the heating cylinder comprises a cylindrical body made of a metal material and at least one electrical resistor for heating it, wherein the at least one electrical resistor is electrically controlled by the ECU to bring the cylindrical body to a set temperature.

According to a possible embodiment, the moving assembly comprises at least one support cylinder rotatable about a rotation axis parallel to the rotation axis of the heating cylinder by means of a motor, wherein the ECU is electrically connected to the motor of the support cylinder to cause the rotation thereof at a set speed.

According to a possible embodiment, at least the collecting cylinder of the absorption material is motorized through an additional motor around its rotation axis, the ECU being electrically connected to the additional motor to cause the rotation of the collecting cylinder at a set speed.

BRIEF DESCRIPTION OF THE SEVERAL VIEWS OF THE DRAWINGS

Further features and advantages of the present invention will be more apparent from the following detailed description, provided by way of non-limiting example and illustrated in the accompanying drawings, wherein.

The same reference numeral and letters in the figures define the same elements or components.

DETAILED DESCRIPTION

Figure 1:
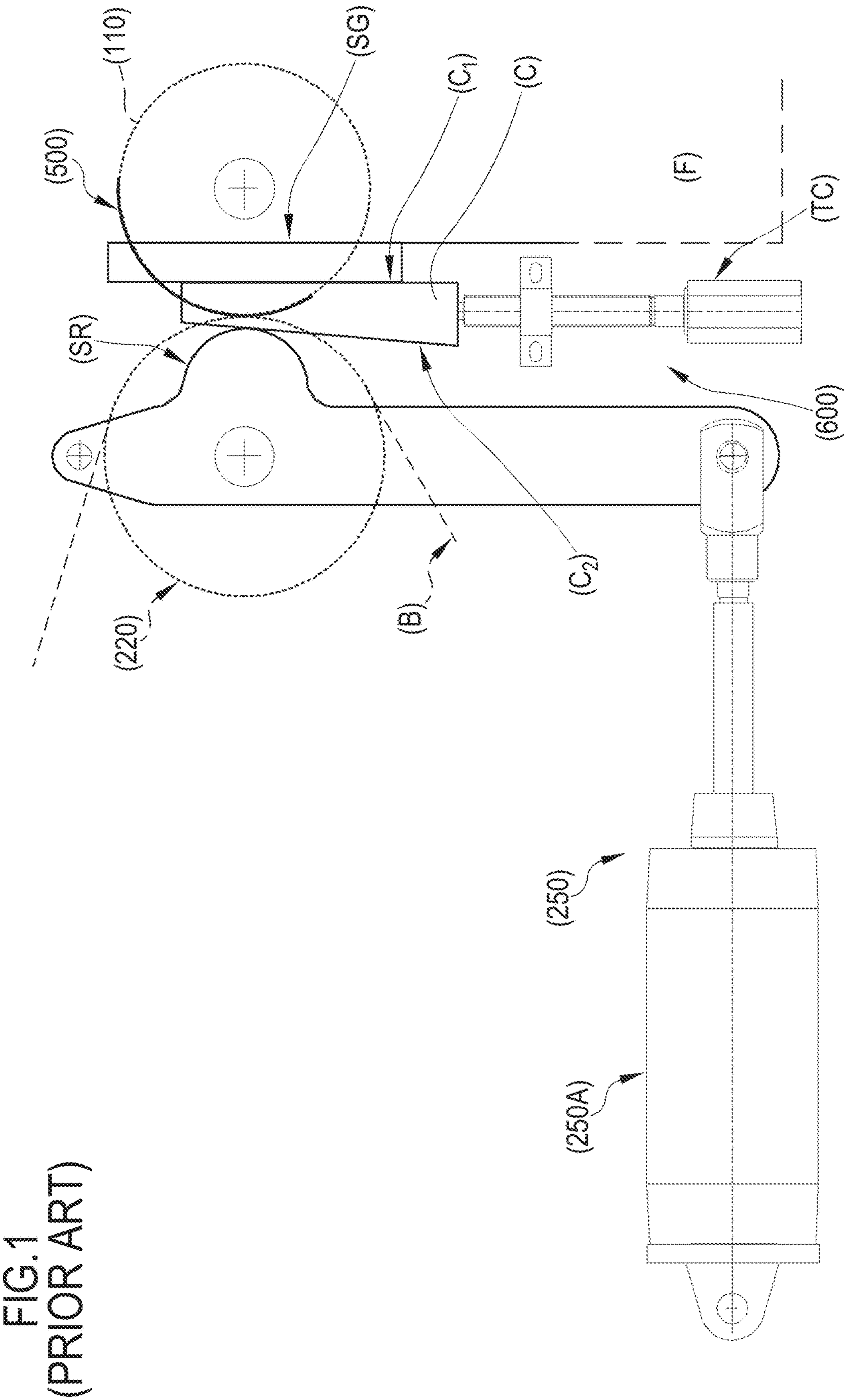
FIG.1 (PRIOR ART)
FIG. 1 is a diagram relating to a prior art solution.
Figure 2:
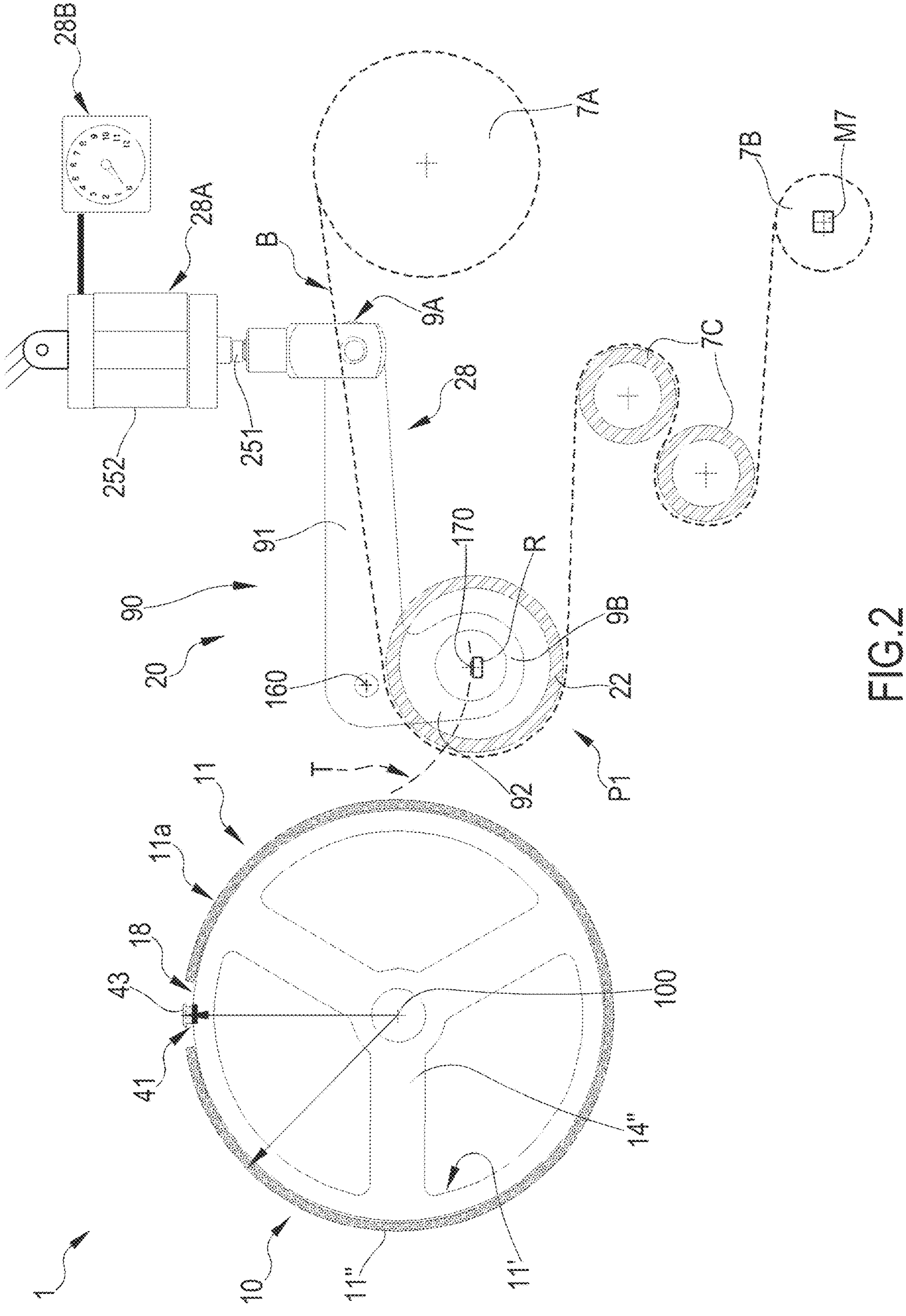
FIG. 2 is a schematic view of a possible embodiment of a thermal development apparatus of a flexographic plate according to the invention in a first operating configuration.

With reference to FIGS. 2 to 7, the present disclosure relates to a thermal development apparatus 1 of a flexographic plate 5 (hereinafter also indicated only as plate 5) shown only in FIG. 2. The plate 5 comprises a first surface 5*a* (or outer surface 5*a*) and a second surface 5*b* (or inner surface 5*b*) defining the "base" layer of the plate 5 which, according to a known solution, can comprise a layer made of Mylar.

One purpose of the apparatus 1 according to the present disclosure may be to allow removal of non-crosslinked polymer or monomer from the first surface 5*a* of the plate 5. The crosslinking process of the polymer or monomer of the plate can take place according to methods known to the person skilled in the art (such as exposure to UV rays). In any case, these methods are not relevant for an invention as disclosed herein unless otherwise expressly noted.

The apparatus 1 comprises a moving assembly 10 for moving the plate 5, which defines a support surface 11*a* for the second surface 5*b* of the plate 5. The moving assembly 10 defines a trajectory along which the plate 5 is moved. As better described below, the moving assembly 10 preferably comprises at least one motorized support cylinder, operated by a motor M, which supports, directly or indirectly, the plate 5.

An apparatus 1 as disclosed herein may comprise a development operating assembly 20 (hereinafter also indicated as operating assembly 20) for applying an absorbent material B (hereinafter also indicated by the term blotter B) to the outer surface 5*a* of the plate 5 during the movement thereof along the trajectory defined by the moving assembly 10. Specifically, this operating assembly 20 comprises feeding means 7A, 7B, 7C having the function of continuously providing the absorbent material B necessary for developing the plate 5. These feeding means comprise at least one feeding cylinder 7A and one collecting cylinder 7B, preferably having parallel rotation axes. As to the blotter B, this can be of any known type suitable for the purpose.

The operating assembly 20 further comprises a heating cylinder 22 (hereinafter also indicated by the expressions heating cylinder 22 or heating roller 22) for heating the outer surface 5*a* of the plate 5 to a predetermined temperature such as to melt/liquefy at least part of the non-crosslinked monomer or polymer. Preferably, this predetermined temperature can vary in a range from 80 to 150° C., depending on the type of material forming the plate 5. As better indicated below, preferably, the heating cylinder 22 comprises a cylindrical body made of metal material heated by at least one electrical resistor R according to a known principle.

The heating cylinder 22 is at least partially enveloped by the absorbent material B fed by the feeding means 7A, 7B, 7C, in particular coming from the feed cylinder 7A.

The operating assembly 20 further comprises a pushing unit 28 acting on the heating cylinder 22 to cause a contact between the absorbent material B and the outer surface of the plate 5 so that the melted polymer or monomer (due to the effect of the thermal energy released by the heating roller 22) is removed/absorbed by the absorbent material B.

In an embodiment as disclosed herein, the pushing unit 28 is configured to bring about the contact condition between the heating roller 22 and the plate 5. For this purpose, the pushing unit 28 comprises at least a pair of pneumatic actuators 28A operatively connected, directly or indirectly, to the heating roller 22 to move it, in a reversible manner, along a predetermined trajectory T. Each of these pneumatic actuators 28A comprises a cylinder 252 fed with pressurized air and a rod 251 movable, relative to the cylinder 252, due to the effect of the pressurized air.

In an embodiment as disclosed herein, the pushing unit 28 comprises a pressure regulating device 28B (hereinafter also indicated by the expression regulating device 28B) configured to adjust the value of the air pressure in the cylinders 252 of the actuators 28A. Further to an initial pressure value, the actuators 28A push the heating cylinder (22) from a non-operating position (indicated by P1 in FIG. 2) to an operating position (indicated by P2 in FIG. 3) on the plate 5, i.e., they bring the heating cylinder 22 in contact, with a certain pressure, with the plate 5. The regulating device 28B may allow this initial pressure value to be varied (i.e., increased or decreased) so as to vary accordingly the operating position of the heating cylinder 22 on the plate 5, i.e., to vary the pressure applied by the heating cylinder 22 on the surface of the plate 5.

In other words, the variation in the air pressure within the cylinders 252 of the actuators 28A translates into a corresponding variation in the thrust that the actuators 28A apply on the heating cylinder 22 and consequently in the pressure applied by the latter on the plate 5. Therefore, while the non-operating position P1 can always be the same, for example the position taken by the heating cylinder 22 when the pressure in the cylinders 252 is zero, the operating position P2 depends on the value of the air pressure in the cylinders 252, wherein the pressure value and the variation thereof are managed by the regulating device 28B.

Basically, the distance between the heating roller 22 and the plate 5 is adjusted by means of the regulating device, even during development of the plate 5, i.e., without the need to stop the movement of the absorbent material B. Through the regulating device 28 the pressure in the cylinders 252 of the actuators (and hence the pressure applied by the heating roller on the plate 5) can thus be increased or decreased, after the plate 5 has moved along the trajectory defined by the moving assembly 10 a predetermined number of times.

Figure 3:
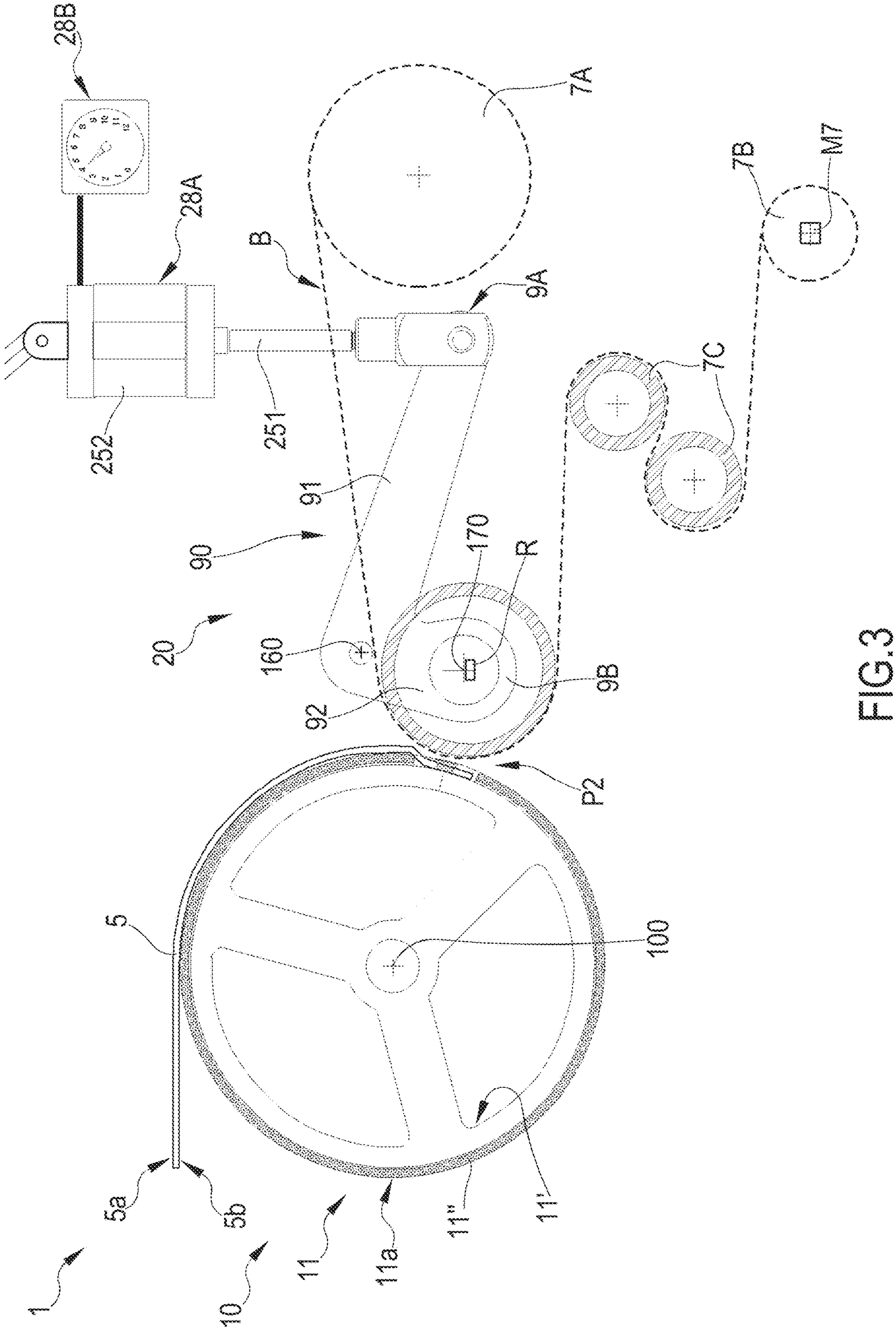
FIG. 3 is a schematic view of the apparatus of FIG. 2 in a second operating configuration.
Figure 4:
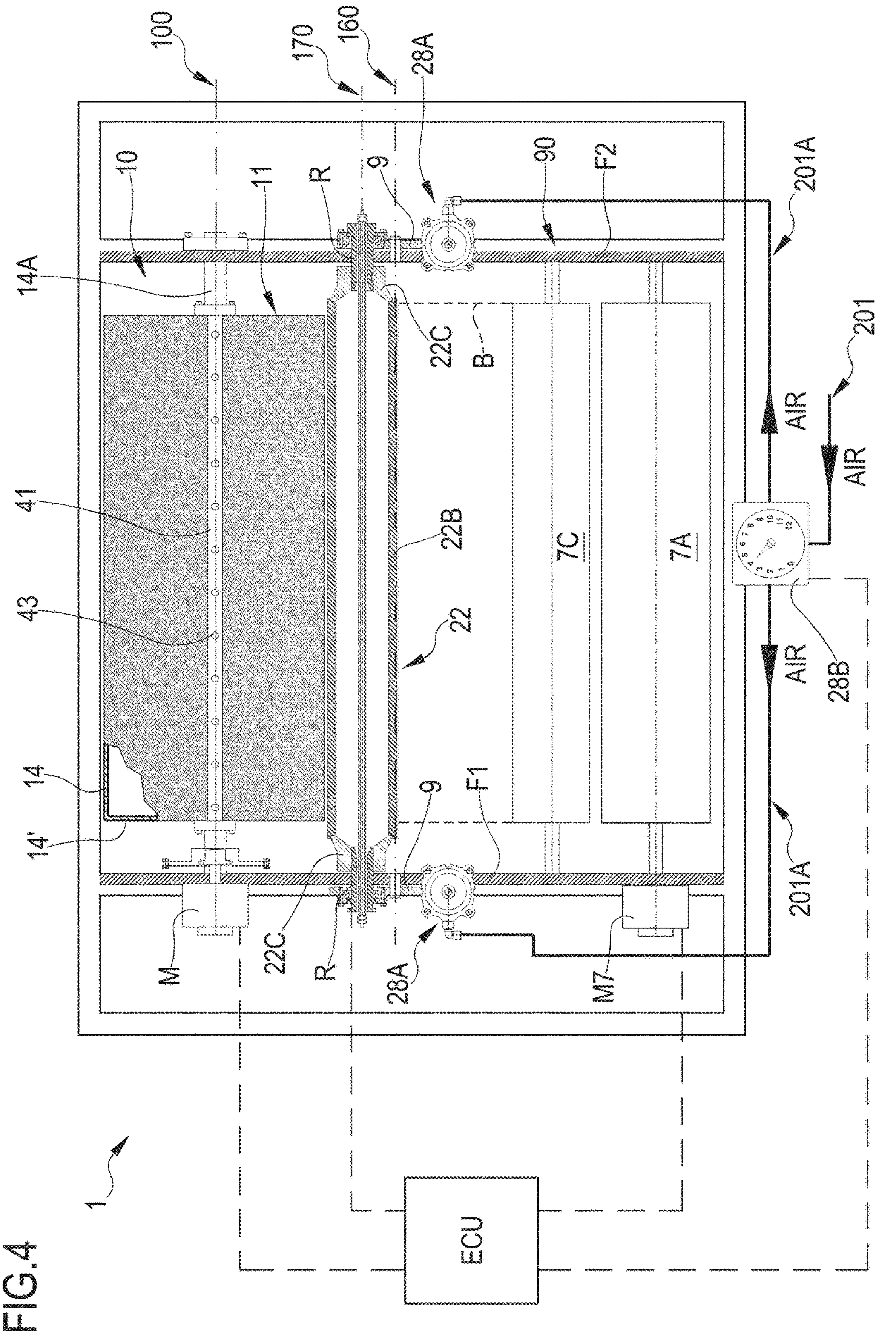
FIG. 4 is a schematic plan view of the apparatus of FIG. 2.

FIGS. 2 to 4 show a possible embodiment of an apparatus as disclosed herein wherein the pushing unit 28 comprises a connecting mechanism 90 that operatively connects the pneumatic actuators 28A to the heating cylinder 22. More precisely, this mechanism 90 is configured so as to define the movement trajectory of the heating cylinder 22 between the non-operating position and the operating position (schematically shown in FIG. 2 and FIG. 3, respectively). As schematized in FIG. 2, the non-operating position corresponds to a condition with no pressure within the cylinders 252, wherein the piston 251 is thus completely retracted inside the corresponding cylinder. Starting from this condition, with an initial pressure value (for example 4 bar as schematically shown in FIG. 3), the heating roller 22, pushed by the actuators 28A, reaches an operating position P2 on the plate 5. In an embodiment, this operating position P2 can be varied by means of the regulating device 28B which is capable of varying the pressure of the air entering the cylinders 252 of the actuators 28A.

With reference in particular to FIG. 4, the apparatus 1 comprises a support frame F1-F2 defining two lateral support sidewalls F1, F2 (hereinafter only indicated as sidewalls F1, F2) that develop substantially on parallel and opposing planes. The heating roller 22 is arranged so that its longitudinal axis 170 is substantially orthogonal to the planes on which these sidewalls F1, F2 develop.

The connecting mechanism 90 comprises a pair of connecting levers 9 each hinged to a corresponding one of the sidewalls F1, F2 so as to rotate about a common rotation axis 160 parallel to the longitudinal axis 170 of the heating cylinder 22. Therefore, also the rotation axis 160 of the levers 9 is substantially orthogonal to the planes on which the two sidewalls F1, F2 develop. Each lever 9 is operatively connected at one side to one of the actuators 28A of the pushing unit 28, and at the other side to the heating cylinder 22 at a corresponding end thereof. More precisely, the two levers 9 of the connecting mechanism 90 rotatably support the heating roller 22, so as to allow it to rotate about its longitudinal axis 170.

As schematically shown in FIG. 4, a pressurized air feed line 201 is provided, along which the regulating device 28B operates. Downstream of the latter, the feed line divides into two branches 201A, each intended to feed a cylinder 252 of a corresponding actuator 28A.

With reference in particular to FIG. 2, the mechanism 90 described above overall defines a movement trajectory T for the heating roller 22 along an arc of a circle whose centre lies on the common rotation axis 160 of the two levers 9. In particular, as apparent from FIG. 2, the trajectory of the longitudinal axis 170 of the heating roller 22 indicated above is taken as the movement trajectory T.

According to an embodiment of an installation mode schematically shown in the figures, for each of the two actuators 28A of the pushing unit 28, the corresponding cylinder 252 is fixed to the support frame F1-F2, preferably to a corresponding one of the two sidewalls F1, F2. For each of the two actuators 28A, the end of the rod 251 is instead fixed to a first end 9A of one of the two levers 9 of the connecting mechanism 90. For each of the two levers 9, a second end 9B rotatably supports one of the ends of the heating cylinder 22.

As apparent from the figures, even more preferably, the two levers 9 have a substantially L-shaped configuration, wherein, for each lever 9, the longer arm 91 of the lever 9 extends between the rotation axis 160 and the first end 9A connected to the end of the rod 251 of a corresponding actuator 28A, whereas the shorter arm 92 extends between the rotation axis 160 and the second end 9B rotatably supporting the heating roller 22.

According to an embodiment as schematically shown in the figures, the apparatus 1 comprises a control unit (hereinafter named ECU) connected to the regulating device 28B to control its operation. In particular, the ECU is configured to send the regulating device 28B a control signal further to which the regulating device 28B increases the air pressure fed into the cylinders 252 of the two actuators 28A by a predetermined value. In this regard, to bring the heating roller 22 from the non-operating position to the operating position, the ECU will send an activation signal so that the pressure in the cylinders 252 of the actuators 28A will be brought to a predetermined initial value sufficient to carry out the movement. The ECU is configured to vary the pressure, with respect to this initial value, in order to modify the contact pressure applied by the heating roller 22 on the plate 5 based on the contingent process needs.

The ECU is further configured also to send at least one other control signal further to which the regulating device 28 decreases the air pressure fed into the cylinders 252 of the two actuators 28 by a predetermined value.

The ECU can be set so that these control signals are generated based on the number of passages of the plate 5 along the movement trajectory thereof. For example, the ECU can control the regulating device 28B to gradually increase the pressure, i.e., to increase it by a predetermined value after a certain number of passages (for example, 1 bar after every two passages). In the same way, the ECU can control the regulating device 28B so as to gradually decrease the air pressure (i.e., decrease it by a predetermined value after a certain number of passages) when the plate 5 has passed over the movement trajectory a given total number of passages.

In any case, the ECU can be set to automatically control the regulating device 28B. Preferably, the ECU comprises a user interface through which an operator can vary the operating parameters (pressure, number of passages, etc.) related to the control of the regulating device. Through this interface, the operator can also control directly, hence outside a preset program, the regulating device 28B to vary the pressure.

According to an embodiment, the ECU is electrically connected also to the at least one electrical resistor R used to heat the cylindrical body, made of metal material, of the heating roller 22. Preferably, the ECU can be connected to a sensor S1, for example of optical type, for detecting the temperature (T) of the outer surface 22 of the heating cylinder 22 on which the absorbent material B runs. Through the ECU, the at least one electrical resistor R can be activated and deactivated so as to maintain the temperature T around a predetermined value or within a range of values.

With reference to the heating cylinder 22, the plan view of FIG. 4 shows a preferred embodiment which has an internally hollow cylindrical body 22B with two support flanges 22C at the ends; the two flanges 22C are each hinged to a respective sidewall F1, F2 to define the rotation axis 170 already mentioned above. The electrical resistor R is arranged inside the hollow cylindrical body 22B and extends through it longitudinally from one side to the other, i.e., from one support flange 22C to the other.

As shown in the figures, in addition to the feeding cylinder 7A and the collecting cylinder 7B, according to a known principle, the feeding means can also comprise tensioning cylinders 7C to adjust the tension of the absorbent material fed by the feeding cylinder. These cylinders 7C preferably have axes parallel to those of the feeding cylinder 7A and of the collecting cylinder 7B.

As schematically shown in the figures, the tensioning cylinders 7C are arranged so as to receive the absorbent material B coming from the heating roller 22. Basically, the absorbent material B is unwound from the feeding cylinder 7A and partially wound around the heating roller 22 and subsequently around the two tensioning cylinders 7C operatively arranged in series; finally, the blotter B is wound and collected around the collecting cylinder 7B. A motor means M7 is provided for rotating the latter, thereby causing the defined movement of the absorbent material between the various cylinders 7A, 7B, 7C.

Preferably, this additional motor M7 can also be operated through the ECU. Basically, through the ECU the additional motor M7 can be activated and stopped. Through the ECU also the rotation speed of the collecting cylinder 7C, and thus the feeding speed of the absorbent material B, can be set (and possibly varied).

In FIGS. 2 to 4 the moving assembly 10 comprises a motorized support cylinder (hereinafter indicated simply by the term cylinder 11) comprising a cylindrical body 11' whose outer surface is covered by a cover layer 11" made of an elastic material capable of withstanding, without deformation, operating temperatures of about 150° C. Even more preferably, the cover layer 11" is formed of two sub-layers, an internal sub-layer having a hardness of about 40 Shore, and an external sub-layer having a hardness of about 20 Shore. However, the possibility of using cover layers with a different structure also falls within the scope of the invention.

The plate 5 is made integral with the cylinder by the use of connection means, better described below. The plate 5 rests with its inner surface 5*b* on the outer surface 11*a* of the cylinder, i.e., on the outermost surface of the cover layer 11". Therefore, the cylinder 11 defines a substantially cylindrical movement trajectory for the plate 5 integral therewith.

As shown in the figures, in particular in FIG. 4, the cylindrical body 11' of the cylinder 11, considered on a cross-sectional plane orthogonal to its rotation axis 100, comprises an outermost cylindrical shell 14 connected to a central shaft 14A by longitudinally spaced heads 14', wherein these heads 14' comprise connection spokes 14" (indicated in FIG. 2). As a whole, the cylindrical body 11' is internally hollow (see again FIG. 4). Advantageously, this configuration helps to dissipate heat and hence helps to preserve the integrity of the base layer of the plate 5.

With reference again to the embodiments in FIGS. 2 to 4 and 6-7, as mentioned above the plate 5 is made integral with the support surface 11*a* defined by the moving assembly using connection means. Preferably the connection means comprise a pin bar 41 which, according to a known principle, is connected to the plate 5 by means of through holes formed in the plate in a position close to an edge thereof.

In the embodiments in FIGS. 2 to 4 and 6-7, the pin bar 41 is advantageously connected to the outer surface 18 of the cylindrical body 11' of the cylinder 11 at a cutoff 60 (indicated in FIG. 6) in the cover layer 11" that extends over the whole longitudinal length of the cylinder 11 (see FIG. 4). In other words, a portion of the outer surface 18 (indicated in FIG. 2) of the cylindrical body 11', to which the pin bar 41 is fixed, is not covered by the cover layer 11". On a cross-sectional plane orthogonal to the axis 100 of the cylinder 11, the cutoff 60 appears as a "circular sector" region around the cylindrical body 11'.

With reference to FIG. 2, further to the connection of the pin bar 41 to the outer surface 18 of the cylindrical body 11', the tips of the pins 43 are placed at a radial distance R1 (measured from the rotation axis of the cylinder 11) smaller than, or at most equal to, the radius R2 of the circumference along which the outermost surface (corresponding to the support surface 11*a*) of the cover layer 11" develops (the radial distance R1 and the radius R2 being considered in a cross-sectional plane orthogonal to the rotation axis 100 of the cylinder 11).

The possibility of making the plate integral with the support surface of the moving assembly by means of other methods with respect to the one described above also falls within the scope of the present invention. In this regard, according to a less preferred embodiment, the pin bar could be fixed directly on top of the cover layer.

In any case, the present invention is not dependent on the configuration of the moving assembly 10 and on the connection method of the plate 5 to the support surface 11A configured by the moving assembly 10.

Figure 5:
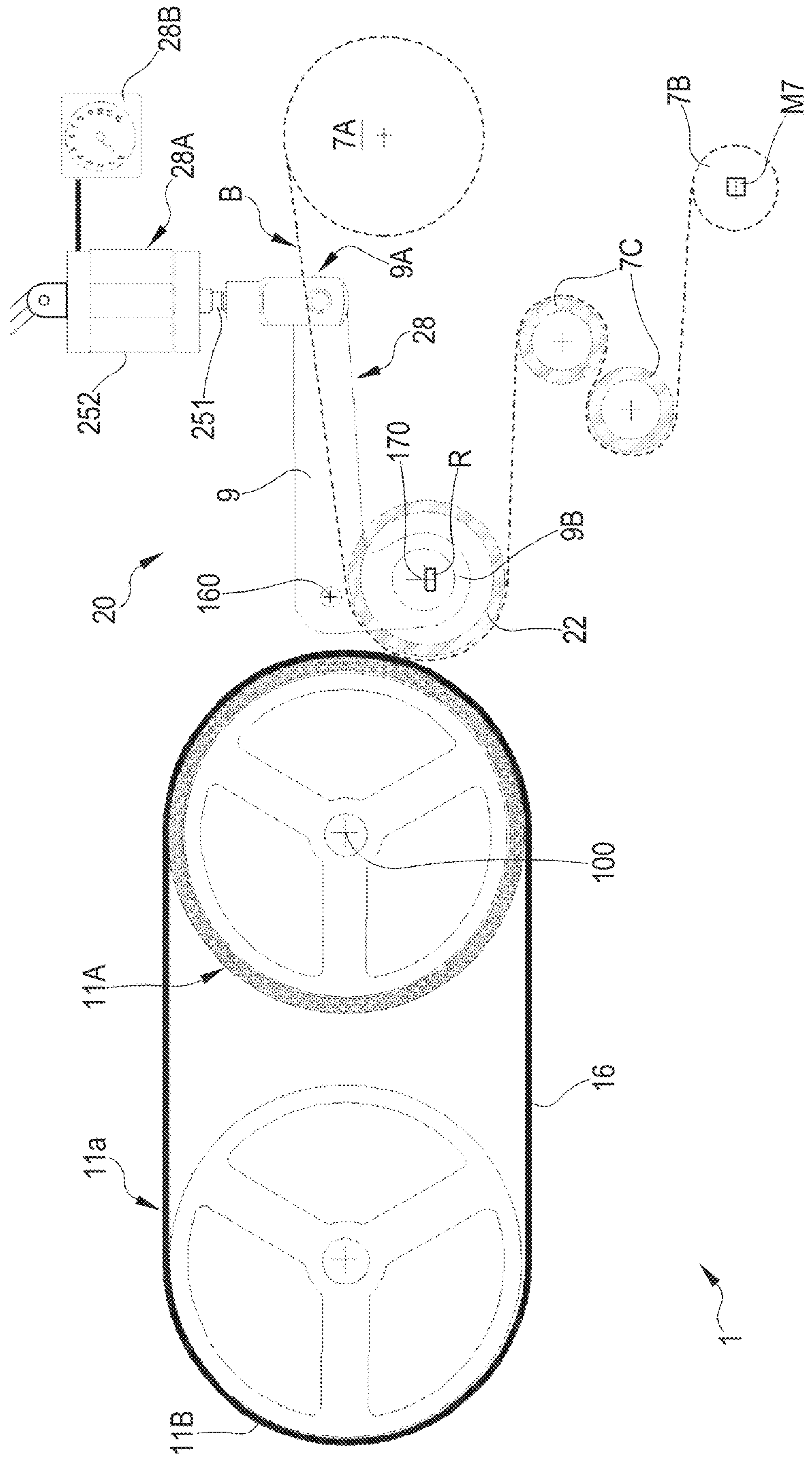
FIG. 5 is a schematic view of another possible embodiment of a thermal development apparatus of a flexographic plate according to the invention.

In this regard, FIG. 5 schematically shows another embodiment of the apparatus according to the invention which differs from those in the other figures by a different configuration of the moving assembly 10. The latter has a conveyor conformation comprising a pair of cylinders 11A-11B (at least one of which, indicated by 11A, is motorized through a motor M), and a belt 16 made to rotate by the cylinders 11A-11B, wherein the belt 16 defines the support surface 11*a* for the plate 5. In this case, the plate 5 is moved along a trajectory substantially conforming to the shape of the belt 16, according to the viewpoint of FIG. 5. The plate 5 can be connected to the support surface 11*a* through one of the methods conventionally used in the case of a conveyor configuration and for this reason not described below.

Both in the case in which the moving assembly 10 comprises a single support cylinder 11 (embodiments in FIGS. 2 to 4 and 6-7), and in the case in which it has a conveyor configuration (embodiment in FIG. 5), preferably, the ECU is electrically connected to the motor M (indicated only in FIG. 4) intended to rotate the motorized support cylinder 11, 11A and hence to move the plate 5. By means of the ECU, this motor M can be activated and stopped and at the same time the rotation speed of the support cylinder 11, 11A, and thus the feed speed of the plate 5, can be set (and possibly varied).

Figure 6:
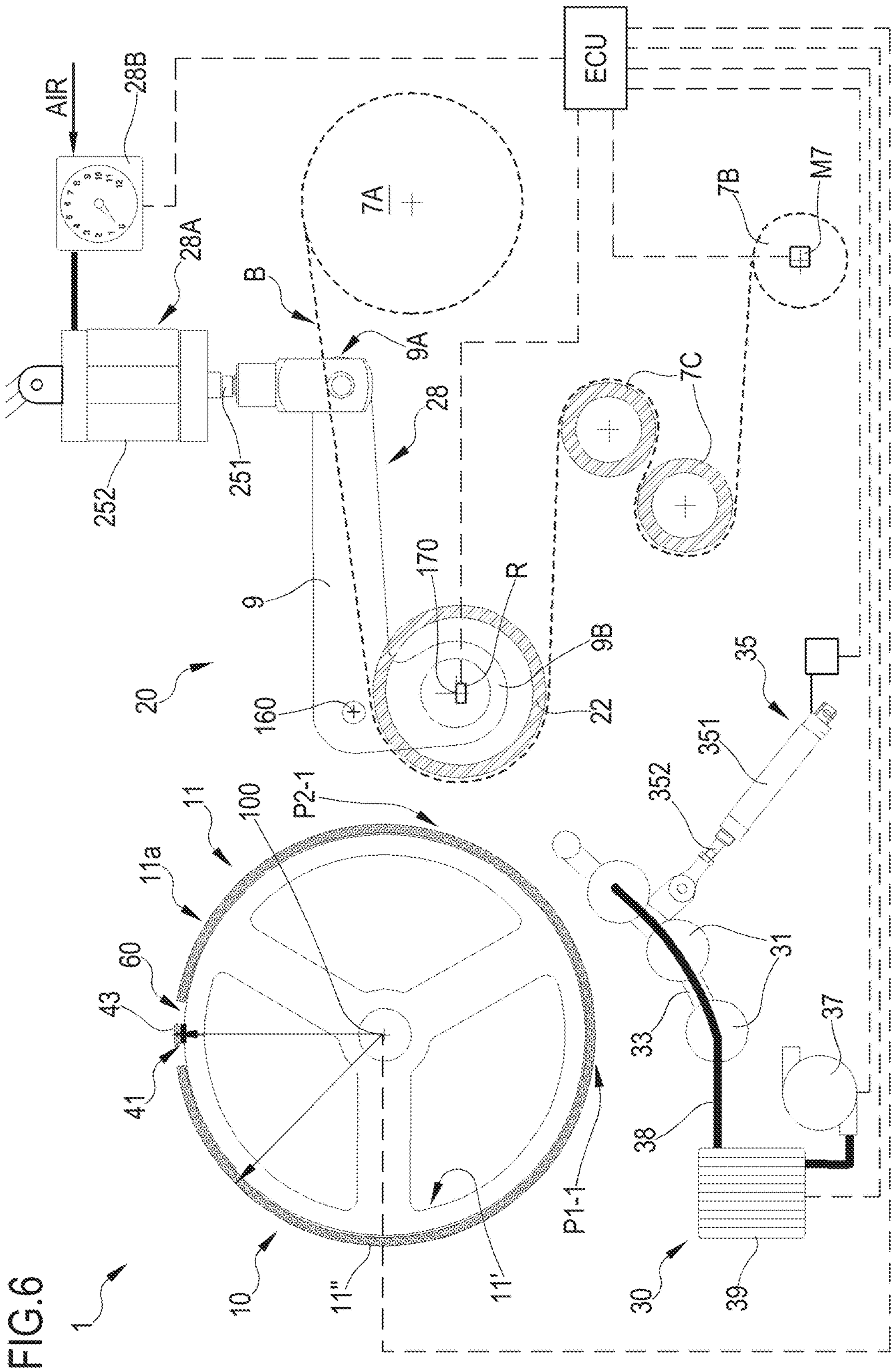
FIGS. 6 and 7 are schematic views of a further embodiment of a thermal development apparatus of a flexographic plate according to the invention in two different operating configurations.
Figure 7:
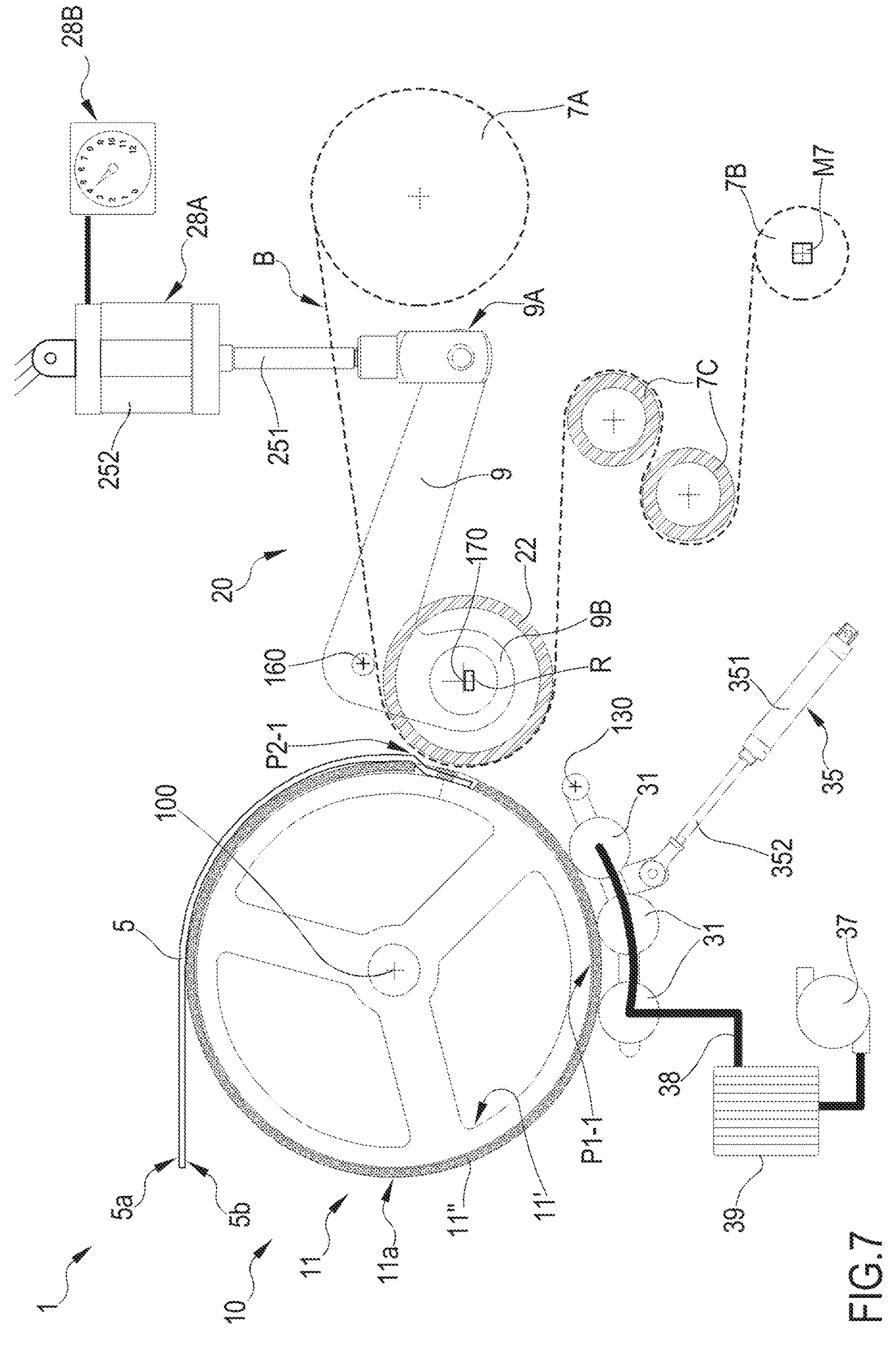

FIGS. 6 and 7 refer to a further embodiment of an apparatus according to the invention which differs from those in FIGS. 2 to 4 due to the presence of a cooling assembly 30 having the function of cooling the plate 5 in an operating position (indicated by P1-1 in FIG. 6) defined downstream of the operating position (indicated by P2-1 in FIG. 6) at which the absorbent material B contacts the outer surface 5*b* of the plate 5, wherein these operating positions are considered along the predetermined movement trajectory of the plate 5. In other words, for each rotation of the plate 5, the cooling assembly 30 acts on the plate 5, thereby cooling it, immediately after removal of the polymer/monomer so as to limit the heat amount in the plate, which would tend to increase due to the action of the heating means of the operating assembly 20. Advantageously, the cooling assembly 30 makes it possible to preserve the integrity of the base film of the plate 5, i.e., to prevent or greatly reduce possible deformations/distortions.

In the embodiment schematically shown in FIGS. 6 and 7, the cooling assembly 30 comprises a plurality of cooling cylinders 31 installed on a support structure 33 rotatable about a rotation axis 130 parallel to the rotation axis 100 of the support cylinder 11 of the moving assembly 10. In particular, the support structure 33 is rotatable about the rotation axis 100 to move the cooling cylinders 31 between a first reference position corresponding to a contact condition with the outer surface 5*a* of the plate 5 (shown in FIG. 7), and a second reference position corresponding instead to a non-contact position with the outer surface 5*b* of the plate 5 (shown in FIG. 6). The cooling assembly 30 further comprises displacement means 35 configured to move, directly or indirectly, the cooling cylinders 31 between the two reference positions indicated above.

Preferably, the temperature value of the outer surface of the cooling cylinders 31 is maintained below a predetermined value, or in a range of predetermined values, by the forced circulation of a cooling fluid, for example water, through the cylinders. In this regard, as schematically shown, the cooling assembly 30 comprises a circulation line 38 of the cooling fluid along which a circulation pump 37 is arranged. A thermal conditioning machine 39 is also provided along the circulation line 38 to condition (in particular to cool) the cooling fluid before it enters the cooling cylinders 31. Preferably, the thermal conditioning machine 39 is of the water/water type, but it could also be of the air/water type.

Preferably, but not exclusively, the circulation pump 37 is operatively arranged upstream of the thermal conditioning machine 39 with respect to the flow direction of the cooling fluid in the circulation line 38. According to a preferred operating mode, the thermal conditioning machine 39 and the circulation pump 38 are maintained constantly activated even at the end of the development process of a plate 5 and hence in the idle period that precedes loading and processing of another plate.

With reference to FIG. 6, preferably the ECU is electrically connected also to the thermal conditioning machine 39, to the circulation pump 37 and to the actuating means 35 for controlling activation, deactivation and the operating mode thereof (for example, to adjust the number of revolutions/flow rate of the circulation pump 37 and/or to adjust the operating temperature of the thermal conditioning machine acting on the cooling fluid).

With reference to the embodiment shown in FIGS. 6 and 7, below is described the operating mode of the apparatus schematically shown, wherein the connections with the ECU are indicated for the sake of clarity only in FIG. 6.

With reference to FIG. 6, in the absence of the plate 5, the pushing unit 25 of the heating cylinder 22 is deactivated so that it is in the non-operating position, i.e., relatively away from the support cylinder 10. In this condition the cylinders 252 of the actuators 28A are not fed (zero feed pressure). At the same time, the cooling cylinders 31 of the cooling assembly 30 take up the second reference position (non-contact position).

Through a control signal provided by the ECU, the heating cylinder 22 is preferably heated before movement of the plate 5 through the support cylinder 11. More precisely, for this purpose, the ECU activates the electrical resistor R so that the temperature of the cylindrical body of the heating roller reaches the desired value. Before the plate is moved, the ECU also activates the conditioning machine 39 and/or the circulation pump 37 of the cooling assembly to bring the cooling cylinders 31 to a predetermined a temperature.

After connecting the plate 5 to the pin bar 41 fixed to the cylinder 11, again through the ECU, the pushing unit 28 of the operating assembly 20 is activated. The two actuators 28A act on the corresponding levers 9 so as to move the heating cylinder 22 into the operating position, i.e., the position in which it contacts the plate 5. More precisely, the activation of the actuators 28A takes place through a control signal sent by the ECU to the pressure regulator 28B, further to which the pressure of the air feed into the cylinders 252 is taken to a predetermined initial value (for example 4 bar, as indicated by the display of the regulating device 28B schematically shown in FIG. 3). Simultaneously or not, the ECU also activates the displacement means 35 of the cooling assembly 30 so as to take the cooling cylinders 31 into the first reference position, i.e., the position in which they can contact the plate 5 to cool it.

After connecting the plate 5 to the cylinder 11, again through the ECU, the motor M for rotating the cylinder 11 and the motor M7 for rotating the collecting cylinder 7B are operated respectively to move the plate 5 and feed the absorbent material B. By means of the heating cylinder 22, the non-crosslinked polymer-monomer is melted and removed from the outer surface 5*a* of the heating cylinder 22 due to the action of the absorbent material B fed around the heating cylinder 22. Further to the movement of the plate 5, the surface portion thereof from which the polymer or monomer has just been removed contacts the cooling cylinders 31 of the moving assembly 30. In this way, the diffusion of heat within the plate 5 is counteracted, and consequently the temperature increase in the base layer is also effectively.

The operation described above is thus controlled and automated through the use of the ECU. In particular, in an automated way or further to an action of an operator, through the ECU it is possible to control the pressure regulator 28B and hence to vary (i.e., increase or decrease) as required (for example based on the type of plate and/or the type of design) the pressure with which the actuators 25A act on the heating cylinder 22, i.e., to modify the initial pressure value indicated above. This variation modifies the contact condition between the heating cylinder 22 with the absorbent material B and the plate 5.

In general, through the ECU it is possible to set the operating parameters of the thermal development process of the plate, in particular the operating temperature of the heating cylinder 22 and the pressure with which it acts on the plate 5, the feed speed of the absorbent material B and the feed speed of the plate 5 and, in the specific case shown in FIGS. 6 and 7, the operating temperature of the cooling cylinders 31.

The solutions described above allow the set aims and objects to be fully achieved. In particular, the developing operating assembly 20 of the apparatus according to the invention has a simpler and less expensive configuration as compared to prior art solutions. Moreover, it allows more precise adjustment of the operating condition of the heating roller.

As mentioned above, the use of the operating assembly 20 according to the principles of the present invention is independent of the configuration of the moving assembly and of the cooling assembly. Therefore, the cooling assembly and the moving assembly can also have configurations different from those described and shown in the figures, in particular configurations already known to the person skilled in the art.

What is claimed is:

1. A thermal development apparatus for removing non-crosslinked polymer or monomer from a first surface of a flexographic plate, wherein the apparatus comprises:

a moving assembly defining a support surface for a second surface of the flexographic plate opposite the first surface, wherein the moving assembly moves the flexographic plate along a predetermined movement trajectory;

at least one cylinder configured to apply an absorbent material to the first surface of the flexographic plate during the movement thereof;

a heating cylinder configured to heat the first surface of the flexographic plate to a temperature sufficient to melt at least a portion of the non-crosslinked polymer/monomer, wherein the absorbent material is fed so as to partially envelop the heating cylinder;

a pushing unit configured to act on the heating cylinder to cause a contact between the absorbent material and the first surface of the flexographic plate so that the melted polymer/monomer is removed by the absorbent material;

wherein the pushing unit comprises at least one pair of pneumatic actuators operatively connected to the heating cylinder, wherein each of the actuators comprises a cylinder supplied with pressurized air and a rod movable with respect to the cylinder, wherein the pushing unit further comprises a pressure regulating device configured to adjust a value of air pressure in the cylinder of each of the actuators, and a connecting mechanism that operatively connects the actuators to the heating cylinder, the connecting mechanism defining a trajectory along which the heating cylinder is moved, wherein corresponding to an initial pressure value the actuators push the heating cylinder from a non-operating position to an operating position on the flexographic plate, wherein the regulating device allows the initial pressure value to be varied so as to vary the operating position, thus causing a consequent variation in the pressure applied by the heating cylinder on the flexographic plate, the apparatus further comprising a support frame comprising a pair of opposing sidewalls, the connecting mechanism comprising a pair of connecting levers hinged to the opposing sidewalls so as to rotate with respect to the sidewalls about a rotation axis parallel to a rotation axis of the heating cylinder, and wherein each of the levers has a substantially L-shaped configuration, wherein a first arm extends from the rotation axis of the heating cylinder to a first end connected to an end of the rod of the corresponding actuator, and wherein a second arm shorter than the first arm extends between the rotation axis of the heating cylinder and a second end rotatably supporting a corresponding end of the heating cylinder.

2. The apparatus of claim 1, comprising a control unit configured to control the regulating device so as to increase or decrease the air pressure in the cylinder upon completion of a predetermined number of passages of the flexographic plate along the predetermined movement trajectory defined by the moving assembly.

3. The apparatus of claim 1, wherein the levers define a trajectory for the heating cylinder, wherein the trajectory for the heating cylinder develops along an arc of a circle whose centre is coaxial to the rotation axis of the levers.

4. The apparatus of claim 2, wherein the heating cylinder comprises a cylindrical body made of a metal material and at least one electrical resistor for heating the cylindrical body, wherein the at least one electrical resistor is electrically connected to and controlled by the control unit to maintain the cylindrical body at a set temperature.

5. The apparatus of claim 2, wherein the moving assembly comprises at least one support cylinder rotatable about a rotation axis parallel to the rotation axis of the heating cylinder via a motor, wherein the control unit is electrically connected to the motor to cause the rotation of the support cylinder at a set speed.

6. The apparatus of claim 5, wherein at least one of the at least one cylinder configured to apply the absorbent material to the first surface is motorized through an additional motor, wherein the control unit is electrically connected to the additional motor to cause the rotation of the collecting cylinder at a set speed.

7. The apparatus of claim 2, wherein at least one of the at least one cylinder configured to apply the absorbent material to the first surface is motorized through a motor, wherein the control unit is electrically connected to the motor to cause the rotation of the collecting cylinder at a set speed.

* * * * *